(12) United States Patent
Kaneko et al.

(10) Patent No.: US 8,228,708 B2
(45) Date of Patent: Jul. 24, 2012

(54) SEMICONDUCTOR MEMORY DEVICE AND A METHOD OF OPERATING THEREOF

(75) Inventors: Yukihiro Kaneko, Osaka (JP); Hiroyuki Tanaka, Kyoto (JP); Michihito Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/222,658

(22) Filed: Aug. 31, 2011

(65) Prior Publication Data

US 2011/0310650 A1 Dec. 22, 2011

Related U.S. Application Data

(63) Continuation of application No. PCT/JP2010/006299, filed on Oct. 25, 2010.

(30) Foreign Application Priority Data

Oct. 29, 2009 (JP) ................. 2009-248715

(51) Int. Cl.
 *G11C 11/22* (2006.01)
(52) U.S. Cl. ............ 365/145; 365/149; 365/185.01; 365/185.14; 365/185.26
(58) Field of Classification Search ............ 365/185.14, 365/185.26, 185.01, 149, 145
 See application file for complete search history.

(56) References Cited

U.S. PATENT DOCUMENTS

| 5,723,885 A | 3/1998 | Ooishi |
| 2002/0054522 A1 | 5/2002 | Inoue et al. |
| 2002/0145904 A1* | 10/2002 | Stern .................... 365/149 |
| 2006/0138520 A1 | 6/2006 | Kang et al. |
| 2009/0152607 A1 | 6/2009 | Tanaka et al. |
| 2009/0173978 A1 | 7/2009 | Kato |
| 2009/0290404 A1 | 11/2009 | Kaneko et al. |

FOREIGN PATENT DOCUMENTS

| GB | 2 367 424 A | 4/2002 |
| JP | 8-335645 A | 12/1996 |
| JP | 2003-163331 A | 6/2003 |
| JP | 2006-190933 A | 7/2006 |
| JP | 2008-263019 | 10/2008 |
| JP | 2008-270313 | 11/2008 |
| JP | 2009-164473 A | 7/2009 |

* cited by examiner

*Primary Examiner* — Jason Lappas

(74) *Attorney, Agent, or Firm* — McDermott Will & Emery LLP

(57) ABSTRACT

In the operating method of the semiconductor memory device, (1) voltages V1, V2, Vs, and Vd, which satisfy V1>Vs, V1>Vd, V2>Vs, and V2>Vd, are applied to a first gate electrode, a second gate electrode, a source electrode, and a drain electrode to write a first resistance value, respectively, (2) the voltages V1, V2, Vs, and Vd, which satisfy V1>Vs, V1>Vd, V2<Vs, and V2<Vd, are applied to write a second resistance value, and (3) the voltages V1, V2, Vs, and Vd, which satisfy V1<Vs, V1<Vd, V2<Vs, and V2<Vd, are applied to write a third resistance value.

6 Claims, 4 Drawing Sheets

|  | SECOND GATE ELECTRODE | FIRST GATE ELECTRODE | SOURCE ELECTRODE | DRAIN ELECTRODE |
|---|---|---|---|---|
| FIRST VALUE | 10 | 10 | 0 | 0 |
| SECOND VALUE | -10 | 10 | 0 | 0 |
| THIRD VALUE | -10 | -10 | 0 | 0 |

UNIT:VOLT (a)

(b)

(c)

SEMICONDUCTOR MEMORY DEVICE AND A METHOD OF OPERATING THEREOF

This is a continuation of International Application No. PCT/JP2010/006299, with an international filing date of Oct. 25, 2010, which claims priority of Japanese Patent Application No. 2009-248715, filed on Oct. 29, 2009, the contents of which are hereby incorporated by reference.

BACKGROUND OF THE INVENTION

1. Field of the Invention

The present disclosure relates to a semiconductor memory device and a method for operating the same. The semiconductor memory device is a field effect transistor type semiconductor memory device having a gate insulation film composed of a ferroelectric film.

2. Description of the Related Art

Japanese Laid-open patent application publication No. Hei 08-335645 (Hereinafter, Patent Literature 1) discloses a semiconductor memory device capable of memorizing multi-value data. FIG. 6(a) shows the semiconductor memory device disclosed in Patent Literature 1. In FIG. 6(a), the reference sign 101 indicates a semiconductor region. The reference signs 102 and 103 indicate a source region and a drain region. The reference sign 104 indicates a channel-forming region. The reference sign 105 indicates a ferroelectric film. The reference sign 106 indicates a gate electrode. The reference sign 107 indicates a back electrode. The reference sign 108 indicates an insulating film. When multi-value data are written into the semiconductor memory device, a predetermined voltage (in FIG. 6(b), as one example, +5 volts) is applied to the back electrode 107 to cause a channel to be an inversion state, thereby setting the voltages of the source region 102 and the drain region 103 the same as the voltage of the channel. Subsequently, a voltage applied to the gate electrode 106 is adjusted according to the multi-value data. Namely, the current flowing through the channel is varied depending on the voltage applied to the gate electrode 106, which is in contact with the ferroelectric film 105.

The semiconductor memory device disclosed in Patent Literature 1 memorizes multi-value data by varying only the voltage applied to the gate electrode 106 contacting the ferroelectric film 105. However, the resistance value of the channel varies in an exponential manner with regard to the voltage applied to the gate electrode 106.

FIG. 2 shows a drain current value when a voltage is applied only to the gate electrode 106 of the semiconductor memory device disclosed in Patent Literature 1. As described above, when the voltage applied to the gate electrode 106 is increased linearly, the drain current value varies in an exponential manner. As a result, a channel resistance value varies significantly depending on fluctuation of the voltage applied to the gate electrode 106. Hence, the controllability of the semiconductor memory device disclosed in Patent Literature 1 is poor.

SUMMARY OF THE INVENTION

The purpose of the present disclosure is to provide a semiconductor memory device and a method for operating thereof capable of memorizing multi-value data with higher controllability.

The method of the present invention is a method for operating a semiconductor memory device, the method comprising steps of:

a step (a) of preparing the semiconductor memory device, the memory device comprising:
   a first gate electrode;
   a ferroelectric film;
   a semiconductor film;
   a source electrode;
   a drain electrode;
   a paraelectric film; and
   a second gate electrode, wherein:
   the first gate electrode, the ferroelectric film, the semiconductor film, the paraelectric film, and the second gate electrode are stacked in this order,
   the source electrode is interposed between the semiconductor film and the paraelectric film, and is in contact with the semiconductor film, and
   the drain electrode is interposed between the semiconductor film and the paraelectric film, and is in contact with the semiconductor film;

a step (b) of writing a first, second, or third resistance value into the semiconductor memory device, wherein:
   when the first resistance value is written into the semiconductor memory device, voltages V1, V2, Vs, and Vd, which satisfy V1>Vs, V1>Vd, V2>Vs, and V2>Vd, are applied to the first gate electrode, the second gate electrode, the source electrode, and the drain electrode, respectively,
   when the second resistance value is written into the semiconductor memory device, voltages V1, V2, Vs, and Vd, which satisfy V1>Vs, V1>Vd, V2<Vs, and V2<Vd, are applied to the first gate electrode, the second gate electrode, the source electrode, and the drain electrode, respectively,
   when the third resistance value is written into the semiconductor memory device, voltages V1, V2, Vs, and Vd, which satisfy V1<Vs, V1<Vd, V2<Vs, and V2<Vd, are applied to the first gate electrode, the second gate electrode, the source electrode, and the drain electrode, respectively, and
   the following relationship is satisfied: the third resistance value>the second resistance value>the first resistance value; and a step (c) of applying an electric potential difference between the source electrode and the drain electrode to determine the resistance value written in the semiconductor memory device out of the first, second, and third resistance values from a current generated between the source electrode and the drain electrode.

One embodiment further includes a reset step of applying the voltage V1, which satisfies V1<V2, to the first gate electrode, while the voltages V2, Vs, and Vd, which satisfy V2=Vs=Vd, are applied to the second gate electrode, the source electrode, and the drain electrode, respectively, wherein the reset step is performed before the step (b).

In one embodiment, in the step (c), the voltages V1 and V2, which satisfy V1=V2, are applied to the first gate electrode and the second gate electrode, respectively.

In one embodiment, in the step (c), V1=V2=0 volts.

The semiconductor memory device of the present invention includes:
   a substrate;
   a first gate electrode disposed on the substrate;
   a ferroelectric layer disposed on the first gate electrode and the substrate;
   a semiconductor layer, having a channel layer, disposed on the ferroelectric layer;
   a source electrode and a drain electrode disposed on the semiconductor layer;

an insulating layer disposed on the semiconductor layer, the source electrode and the drain electrode; and a second gate electrode disposed on the insulating layer, wherein:

a resistance value of the channel layer is controlled by a voltage applied to the first gate electrode V1, a voltage applied to the second gate electrode V2, a voltage applied to the source electrode Vs and a voltage applied to the drain electrode Vd.

In one embodiment, the semiconductor memory device is configured so that:

a first resistance value is written into the channel layer of the semiconductor memory device, when voltages V1, V2, Vs and Vd, which satisfy V1>Vs, V1>Vd, V2>Vs, and V2>Vd, are applied to the first gate electrode, the second gate electrode, the source electrode, and the drain electrode, respectively, a second resistance value is written into the channel layer of the semiconductor memory device, when voltages V1, V2, Vs, and Vd, which satisfy V1>Vs, V1>Vd, V2<Vs, and V2<Vd, are applied to the first gate electrode, the second gate electrode, the source electrode, and the drain electrode, respectively, a third resistance value is written into the channel layer of the semiconductor memory device, when voltages V1, V2, Vs, and Vd, which satisfy V1<Vs, V1<Vd, V2<Vs, and V2<Vd, are applied to the first gate electrode, the second gate electrode, the source electrode, and the drain electrode, respectively, and the third resistance value is larger than the second resistance value, and the second resistance value is larger than the first resistance value.

In one embodiment, wherein the semiconductor memory device is further configured so that:

the semiconductor memory device is reset to a predetermined state by applying voltage V1 and V2, which satisfies V1<V2, to the first gate electrode and the second gate electrode, respectively, while voltage Vs and Vd, which satisfy V2=Vs=Vd, are applied to the source electrode, and the drain electrode, respectively.

In one embodiment, the semiconductor memory device is further configured so that:

written resistance value is read by applying voltages Vs and Vd, which satisfy Vs<Vd or Vd>Vs, to the source electrode and the drain electrode, respectively.

In one embodiment, when reading the written resistance value, voltages V1 and V2, which satisfy V1=V2, are applied to the first gate electrode and the second gate electrode, respectively.

In one embodiment, when reading the written resistance value, voltages V1 and V2, which satisfy V1=V2=0V, are applied to the first gate electrode and the second gate electrode, respectively.

In one embodiment, the ferroelectric layer is $Pb(Zr,Ti)O_3$, $Sr(Bi,Ta)O_x$ or BiTiO.

In one embodiment, the semiconductor layer is ZnO, GaN or $InGaZnO_x$.

In one embodiment, the insulating layer is SiN, $Al_2O_3$ or $HfO_2$.

The present disclosure provides a method for operating a semiconductor memory device capable of memorizing multi-value data with higher controllability.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 3 shows examples of the voltages applied to the electrodes during writing of the multi-value data in the embodiment 1.

DETAILED DESCRIPTION OF PREFERRED EMBODIMENTS

The embodiment of the present invention is described below with reference to the drawings.

(Embodiment 1)

Figure 1:
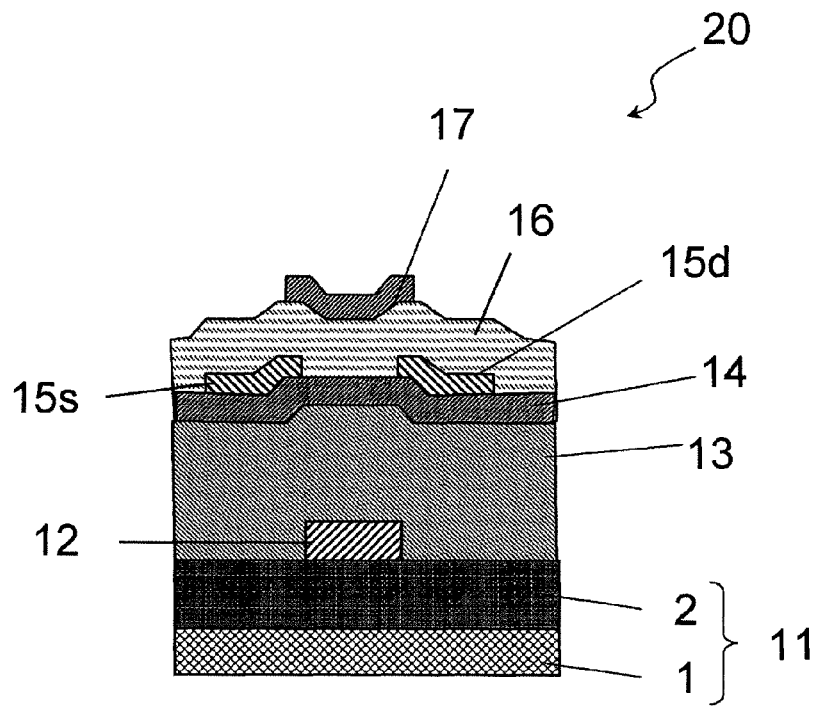
FIG. 1 shows an exemplary cross-sectional view of the semiconductor memory device according to the embodiment 1.
Figure 2:
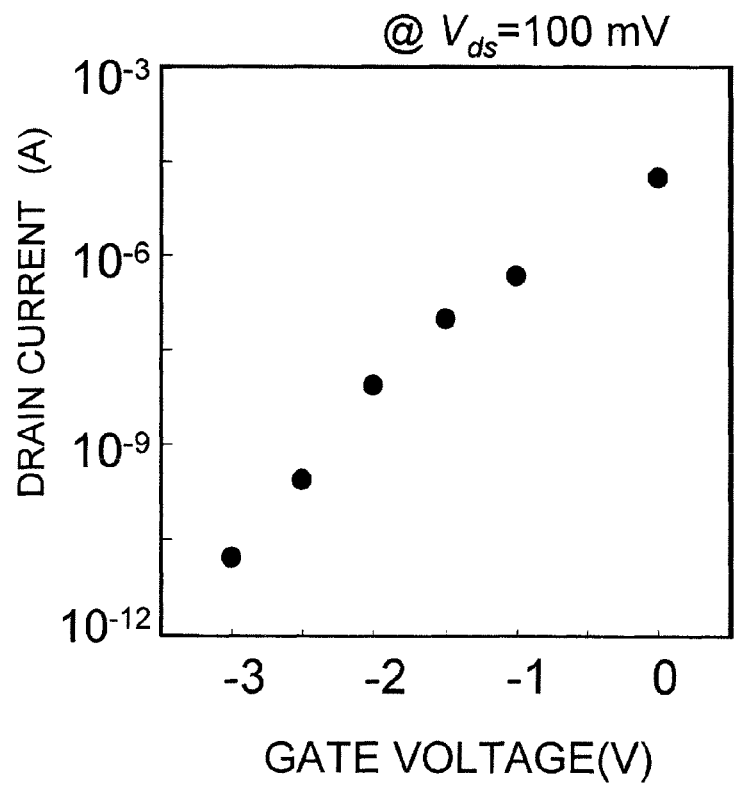
FIG. 2 is a graph showing the measurement result of the drain current value when the multi-value data are written with use of only the gate electrode 106 in the semiconductor memory device disclosed in Patent Literature 1.

FIG. 1 shows an exemplary cross-sectional view of the semiconductor memory device in the embodiment 1.

The semiconductor memory device in the embodiment 1 includes a first field effect transistor and a second field effect transistor. As shown in FIG. 1, a ferroelectric film 13 and a paraelectric film 16 are stacked on a substrate 11 through a semiconductor layer 14. A first gate electrode 12 is interposed between the ferroelectric film 13 and the substrate 11. A second gate electrode 17 is formed on the paraelectric film 16. A source electrode 15s and a drain electrode 15d are interposed between the semiconductor film 14 and the paraelectric film 16.

The first field effect transistor is composed of the first gate electrode 12, the ferroelectric film 13, the source electrode 15s, the drain electrode 15d, and the semiconductor film 14. The second field effect transistor is composed of the second gate electrode 17, the paraelectric film 16, the source electrode 15s, the drain electrode 15d, and the semiconductor film 14.

In the present semiconductor memory device, a current flowing through a channel is controlled depending on the direction and the intensity of polarization in the ferroelectric film 13. Namely, when the ferroelectric film 13 has a polarization direction toward a channel, which is a direction from the first gate electrode 12 to the semiconductor film 14, electrons are induced in the semiconductor layer 14. This causes the semiconductor layer 14 to be under a low resistance state. On the other hand, when the ferroelectric film 13 has the reverse polarization direction opposite to the channel, electrons are drained from the semiconductor layer 14. This causes the semiconductor layer 14 to be under a high resistance state. Furthermore, by varying the intensity of the polarization, the semiconductor memory device can have two or more resistance states.

(Writing)

Next, with reference to FIG. 3 and FIGS. 4(a) to 4(c), a method for writing data into the semiconductor memory device is described below.

Figure 4:
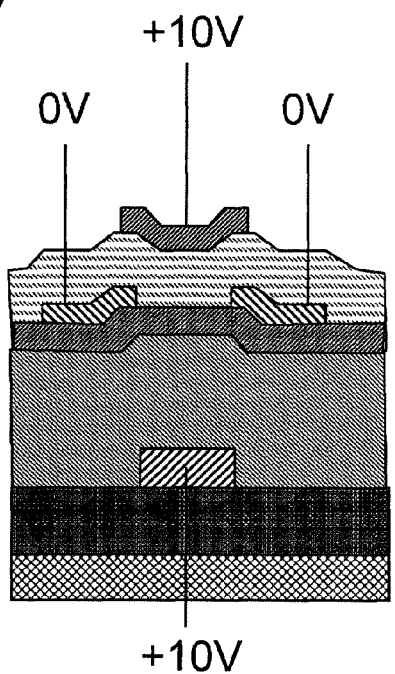
FIG. 4(a) is an exemplary cross-sectional view showing each voltage when the first resistance value is written.
FIG. 4(b) is an exemplary cross-sectional view showing each voltage when the second resistance value is written.
FIG. 4(c) is an exemplary cross-sectional view showing each voltage when the third resistance value is written.
Figure 4:
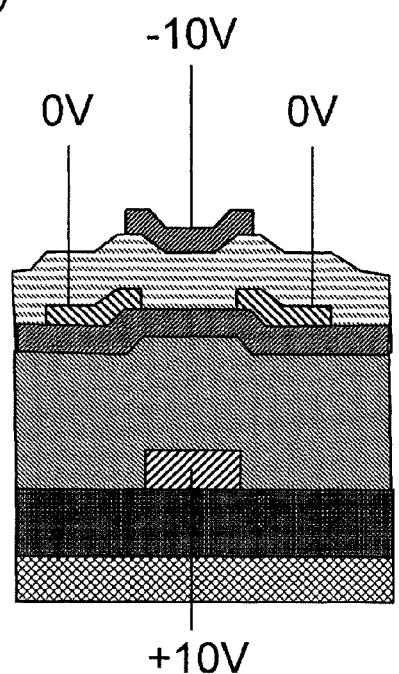
Figure 4:
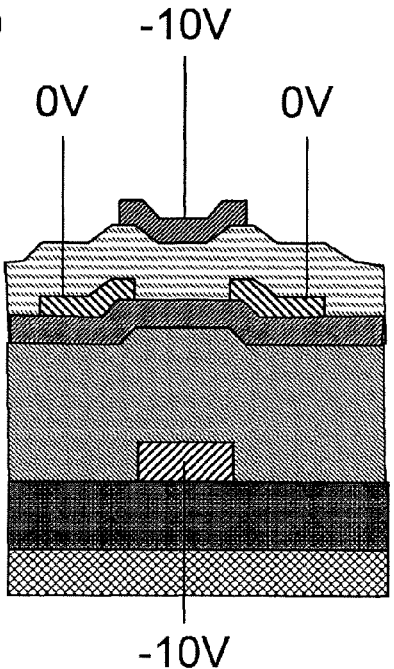

FIG. 3 shows examples of the voltages of the first gate electrode 12, the second gate electrode 17, the source electrode 15s, and the drain electrode 15d, when a first resistance value, a second resistance value, and a third resistance value are written. FIG. 4(a) is a cross-sectional view showing each voltage when the first resistance value is written. FIG. 4(b) is a cross-sectional view showing each voltage when the second resistance value is written. FIG. 4(c) is a cross-sectional view showing each voltage when the third resistance value is written. The first, second and third resistance values are resistances of the channel of the semiconductor layer 14.

An example of a method for writing the first, second, and third resistance values is described below.

It is preferable that a reset operation is performed before each resistance value is written. In the reset operation, a voltage of V1 which satisfies an inequity: V1<V2 is applied to the first gate electrode 12, while voltages of V2, Vs, and Vd which satisfy V2=Vs=Vd are applied to the second gate electrode 17, the source electrode 15s, and the drain electrode 15d, respectively. More particularly, while 0 volts is applied to the source electrode 15s, the drain electrode 15d, and the second gate electrode 17, −10 volts is preferably applied to the first gate electrode 12. This causes the directions of all the polarization of the ferroelectric film to be downward.

By performing the reset operation, the condition of the polarization before the data are written is always set at a predetermined condition.

When the first resistance value is written, the voltages V1, V2, Vs, and Vd, which satisfy V1>Vs, V1>Vd, V2>Vs, and V2>Vd, are applied to the first gate electrode 12, the second gate electrode 17, the source electrode 15s, and the drain electrode 15d, respectively. More particularly, while the voltage of the source electrode 15s and the voltage of the drain electrode 15d are maintained at 0 volts, +10 volts is applied to the first electrode 12a, and +10 volts is applied to the second electrode 17. Thus, the polarization of the ferroelectric film 13 is varied.

When the second resistance value is written, the voltages V1, V2, Vs, and Vd, which satisfy V1>Vs, V1>Vd, V2<Vs, and V2<Vd, are applied to the first gate electrode 12, the second gate electrode 17, the source electrode 15s, and the drain electrode 15d, respectively. More particularly, while the voltage of the source electrode 15s and the voltage of the drain electrode 15d are maintained at 0 volts, +10 volts is applied to the first electrode 12a, and −10 volts is applied to the second electrode 17. Thus, the polarization of the ferroelectric film 13 is varied.

When the third resistance value is written, the voltages V1, V2, Vs, and Vd, which satisfy V1<Vs, V1<Vd, V2<Vs, and V2<Vd, are applied to the first gate electrode 12, the second gate electrode 17, the source electrode 15s, and the drain electrode 15d, respectively. More particularly, while the voltage of the source electrode 15s and the voltage of the drain electrode 15d are maintained at 0 volts, −10 volts is applied to the first electrode 12a, and −10 volts is applied to the second electrode 17. Thus, the polarization of the ferroelectric film 13 is varied.

Here, the following relationship is satisfied: the third resistance value>the second resistance value>the first resistance value. Namely, the following relationship is satisfied: the intensity of the polarization in the ferroelectric film in the first resistance value>the intensity of the polarization in the ferroelectric film in the second resistance value>the intensity of the polarization in the ferroelectric film in the third resistance value.

(Reading)

An example of reading the data written in the semiconductor memory device is described below.

While 0 volts is applied to both of the first gate electrode 12 and the second gate electrode 17, a voltage having a potential difference is applied between the source electrode 15s and the drain electrode 15d to measure the current flowing through the channel layer (the semiconductor layer 14). It is preferable that the voltage applied between the source electrode 15s and the drain electrode 15d is not more than one-fifth of the voltage applied to the first electrode 12 during the writing operation. As one example, the potential difference between the source electrode 15s and the drain electrode 15d is 0.1 volt.

The resistance value is determined depending on the magnitude of the flowing current. Namely, from the measured current, the value written in the semiconductor memory device is determined out of the first, second, and third resistance values. The magnitude of the flowing current satisfies the following relationship: the current in the first resistance value>the current in the second resistance value>the current in the third resistance value.

In the semiconductor memory device disclosed in Patent Literature 1, the multiple-value data are written by varying the voltage applied to the gate electrode 106, which is in contact with the ferroelectric film. On the other hand, in the present embodiment, the multiple-value data composed of the first, second, and third resistance values are written by varying the potentials of the first gate electrode 12 and the second gate electrode 17.

Even when the voltage applied to the first gate electrode 12 is the same, if the voltage applied to the second gate electrode 17 is different, the written resistance value is different. When a positive voltage is applied to the second gate electrode 17, electrons are induced in the channel. The electrons draw the polarization in the ferroelectric film 13. In this manner, the polarization of the ferroelectric film 13 is polarized to the channel side more strongly.

On the contrary, when a negative voltage is applied to the second electrode 12, electrons are drained from the channel. This weakens the polarization of the ferroelectric film 13a to the channel side. Note that the polarization is not necessarily stronger, even when the electric potential difference between the first gate electrode 12 and the second gate electrode 17 is larger.

Typically, in order to enhance the polarization of the ferroelectric film 13, it is possible that the electric potential difference between the first gate electrode 12 and the second gate electrode 17 is increased. However, in the present embodiment, in order to polarize the ferroelectric film 13 strongly, it is not necessary that the electric potential difference between the first gate electrode 12 and the second gate electrode 17 is increased because of the existence of the semiconductor layer 14.

EXAMPLE

The present subject matter is described in more detail with reference to the following example.

Example 1

As the substrate 11, a silicon substrate 1 having a surface coated by a silicon oxide film 2 was used.

(1) The first gate electrode 12 was formed on the silicon substrate 1 as below. A titanium film with a thickness of 5 nanometers and a platinum film with a thickness of 30 nanometers were formed in this order on a [resist] pattern formed on the silicon substrate 1 by photolithography. Furthermore, a SrRuO$_3$ film with a thickness of 10 nanometers was formed by a pulse laser deposition technique. Subsequently, a pattern of the first gate electrode 12 was formed by a lift-off technique.

(2) The substrate was heated to 700 degrees Celsius, and the ferroelectric film 13 made of Pb(Zr,Ti)O$_3$ with a thickness of 450 nanometers was formed with a pulsed laser deposition technique.

(3) The temperature of the substrate was set at 400 degrees Celsius, and the semiconductor layer 14 made of ZnO with a thickness of 30 nanometers was formed with a pulsed laser deposition technique.

(4) A resist pattern was formed on the semiconductor film 14 by photolithography, and an unnecessary part of the semiconductor film 14 was removed by etching with use of sulfuric acid.

(5) Subsequently, a resist pattern was formed on the semiconductor film 14 by photolithography again. A titanium film with a thickness of 5 nanometers and a platinum film with a thickness of 30 nanometers were formed by an electron beam deposition technique over the resist pattern. Furthermore, the resist pattern was removed to form the source electrode 15s and the drain electrode 15d (lift-off technique).

(6) The paraelectric film 16 made of SiN with a thickness of 100 nanometers was formed by a sputtering technique in such a manner that the source electrode 15s, the drain electrode 15d, and the semiconductor film 14 were covered.

(7) A resist pattern was formed by a photolithography technique on the paraelectric film 16. Subsequently, openings (not shown) were formed in the paraelectric film 16 by a reactive ion etching technique. Electric wires for connecting the source electrode 15s and the drain electrode 15d to external portions were formed in the openings in the later step.

(8) A resist pattern was formed by a photolithography technique, and a titanium film with thickness of 5 nanometers, a platinum film with a thickness of 30 nanometers, and a gold film with a thickness of 170 nanometers were formed on the resist pattern. Subsequently, unnecessary parts of the titanium film, the platinum film, and the gold film were removed with use of a lift-off process to form the second gate electrode 17. Thus, the semiconductor memory device was obtained. The channel width of the semiconductor memory device was 100 micrometers. The channel length of the semiconductor memory device was 3 micrometers.

Figure 5:
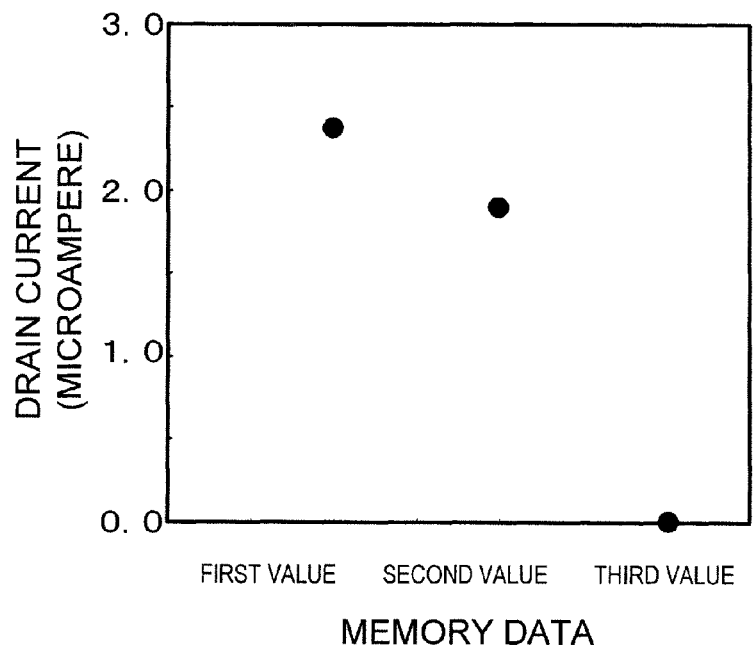
FIG. 5 shows a measurement result of the current during reading the multi-value data in the example 1.
Figure 6:
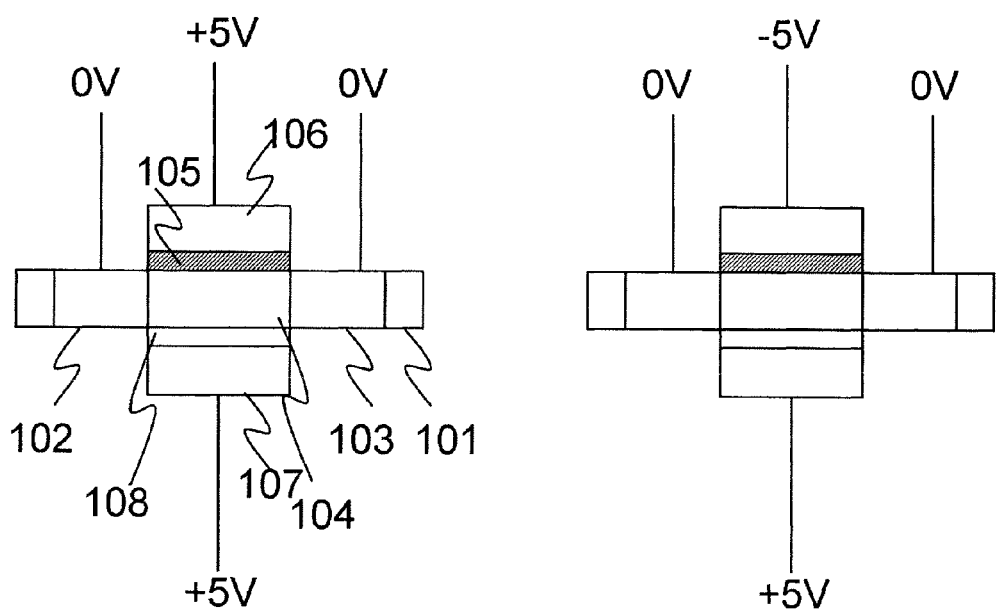
FIGS. 6(a) and 6(b) show a cross-sectional view of the semiconductor memory device disclosed in Patent Literature 1.

Data corresponding to the first to third resistance values were written into the semiconductor memory device on the basis of FIG. 3 and FIGS. 4(a) to 4(c). Subsequently, an electric potential difference of 0.1 volts was applied between the source electrode 15s and the drain electrode 15d to read the data. FIG. 5 shows the result. In the semiconductor memory device according to the example 1, the following relationships were satisfied: the magnitude of the current in the first resistance value>the magnitude of the current in the second resistance value>the magnitude of the current in the third resistance value. Unlike the memory device disclosed in Patent Literature 1, the current (i.e., the drain current) varies almost linearly with respect to the resistance value of the channel. Accordingly, it is possible to more precisely control writing/reading of multi-value data in the present semiconductor memory device.

In the example 1, the laminate of SrRuO$_3$/Pt/Ti, the laminate of Au/Pt/Ti, the laminate of Pt/Ti, and the laminate of Pt/Ti were used as the first gate electrode 12, the second gate electrode 17, the source electrode 15s, and the drain electrode 15d, respectively. However, the materials of the electrodes are not limited. Other conductive materials may be used.

Similarly, the material of the ferroelectric film 13 may be other ferroelectric material such as Sr(Bi,Ta)O$_x$ or BiTiO$_x$. The material of the semiconductor film 14 may be other semiconductor material such as GaN or InGaZnO$_x$. The material of the insulating film 16 may be other insulating material such as Al$_2$O$_3$ and HfO$_2$.

The present subject matter provides a semiconductor memory device capable of memorizing multi-value data with higher controllability.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for operating a semiconductor memory device, the method comprising steps of:
   (a) preparing the semiconductor memory device comprising:
      a first gate electrode;
      a ferroelectric film;
      a semiconductor film;
      a source electrode;
      a drain electrode;
      a paraelectric film; and
      a second gate electrode, wherein
   the first gate electrode, the ferroelectric film, the semiconductor film, the paraelectric film, and the second gate electrode are stacked in this order;
   the source electrode is interposed between the semiconductor film and the paraelectric film, and is in contact with the semiconductor film; and
   the drain electrode is interposed between the semiconductor film and the paraelectric film, and is in contact with the semiconductor film; and
   (b) writing a first, second, or third resistance value into the semiconductor memory device, wherein
   when the first resistance value is written into the semiconductor memory device, voltages V1, V2, Vs, and Vd which satisfy an inequality set: V1>Vs, V1>Vd, V2>Vs, and V2>Vd, are applied to the first gate electrode, the second gate electrode, the source electrode, and the drain electrode, respectively;
   when the second resistance value is written into the semiconductor memory device, voltages V1, V2, Vs, and Vd which satisfy an inequality set: V1>Vs, V1>Vd, V2<Vs, and V2<Vd, are applied to the first gate electrode, the second gate electrode, the source electrode, and the drain electrode, respectively;
   when the third resistance value is written into the semiconductor memory device, voltages V1, V2, Vs, and Vd which satisfy an inequality set: V1<Vs, V1<Vd, V2<Vs, and V2<Vd, are applied to the first gate electrode, the second gate electrode, the source electrode, and the drain electrode, respectively;
   the following inequality set is satisfied: the third resistance value>the second resistance value>the first resistance value; and (c) applying an electric potential difference between the source electrode and the drain electrode to determine the resistance value written in the semiconductor memory device out of the first, second, and third resistance values from a current generated between the source electrode and the drain electrode.

2. The method according to claim 1, further comprising a reset step of applying the voltage V1 which satisfies an inequality: V1<V2 to the first gate electrode, while the voltages V2, Vs, and Vd which satisfy an equality: V2=Vs=Vd are applied to the second gate electrode, the source electrode, and the drain electrode, respectively, wherein, the reset step is performed before the step (b).

3. The method according to claim 1, wherein, in step (c), the voltages V1 and V2 which satisfy an equality: V1=V2 are applied to the first gate electrode and the second gate electrode, respectively.

4. The method according to claim 2, wherein, in step (c), the voltages V1 and V2 which satisfy an equality: V1=V2 are applied to the first gate electrode and the second gate electrode, respectively.

5. The method according to claim 3, wherein, V1=V2=0 volts.

6. The method according to claim 4, wherein V1=V2=0 volts.

* * * * *